United States Patent [19]

Umezu

[11] Patent Number: 4,566,750

[45] Date of Patent: Jan. 28, 1986

[54] PLASTIC INSERT-MOLD ELEMENT CONTAINING A METAL-PIECE INSERT

[76] Inventor: Hideo Umezu, 5-39-6 Shonan Takatori, Yokosuka-shi, Kanagawa-ken, Japan

[21] Appl. No.: 479,455

[22] Filed: Mar. 28, 1983

[30] Foreign Application Priority Data

Jul. 12, 1982 [JP] Japan .................. 57-119877

[51] Int. Cl.$^4$ .............................................. H02B 1/02
[52] U.S. Cl. ........................ 339/126 R; 339/218 R; 339/220 R; 339/276 SF; 411/38; 411/43; 411/70
[58] Field of Search ................. 339/276 SF, 220, 221, 339/218, 126, 217 S; 29/837, 838, 845, 450, 418; 411/34–38, 43, 70

[56] References Cited

U.S. PATENT DOCUMENTS

| | | | |
|---|---|---|---|
| 3,104,925 | 9/1963 | Macnamara | 339/126 RS |
| 3,267,205 | 8/1966 | Dozier | 411/43 |
| 3,336,570 | 8/1967 | Touchel | 339/220 R |
| 3,671,920 | 6/1972 | Iantorno et al. | 339/221 R |
| 3,957,337 | 5/1976 | Damiano | 339/217 S |
| 3,958,859 | 5/1976 | Schmid | 339/217 S |
| 4,026,629 | 5/1977 | Dechelette et al. | 339/220 R |
| 4,146,286 | 3/1979 | Jones | 339/126 RS |
| 4,260,216 | 4/1981 | Ackerman | 339/276 SF |
| 4,329,006 | 5/1982 | Gale | 339/126 R |
| 4,355,934 | 10/1982 | Denham et al. | 411/43 |
| 4,384,757 | 5/1983 | Andrews et al. | 339/221 R |

FOREIGN PATENT DOCUMENTS

| | | | |
|---|---|---|---|
| 2301944 | 7/1973 | Fed. Rep. of Germany | 411/43 |
| 8200049 | 7/1983 | France | 411/43 |

Primary Examiner—Gil Weidenfeld
Assistant Examiner—David L. Pirlot
Attorney, Agent, or Firm—Schwartz & Weinrieb

[57] ABSTRACT

A plastic insert-mold element comprises a plastic female member and a metal piece member insert-molded within the female member and provided with one or more frangible portions formed by cutting notches and/or a perforation therein. The metal piece member is pulled up and slid up the interior of the female member inserted through fitting holes in objects such as panels, consequently to effect panel-to-panel or panel-to-part fixation and electrical connection by a simple operation. The frangible portions of the metal piece member are torn off by continued work of pulling up the metal piece member, to remove an unnecessary portion protruding from the female member.

27 Claims, 41 Drawing Figures

Fig_1 (PRIOR ART)

Fig_2 (PRIOR ART)

Fig_3 (PRIOR ART)

Fig_4

Fig_5

Fig_6

Fig_29

Fig_30

Fig_31

Fig_33

Fig_32

Fig_34

Fig_35

Fig_36

PLASTIC INSERT-MOLD ELEMENT CONTAINING A METAL-PIECE INSERT

FIELD OF THE INVENTION

This invention relates to a plastic insert-mold element having a metal piece inserted therein.

BACKGROUND OF THE INVENTION

The insert-mold element which is obtained by insert molding a metal piece with a plastic member and which allows the metal piece to fulfill a prescribed function by causing the portion of the metal piece which protrudes from the plastic member to be nipped and pulled out has heretofore come in various types depending on the kinds of functions to be fulfilled. In the insert-mold element of one such type, when the unnecessary part of the metal piece protruding from the plastic member is desired to be removed after the metal piece has been pulled out, it has been conventionally necessary to prepare a shearing means such as a cutter to remove the unnecessary part of the metal piece.

OBJECT OF THE INVENTION

An object of the present invention is to provide a plastic insert-mold element which confers upon the metal piece what may be termed as "self-shearing function", that is, an ability to effect the required removal of the unnecessary part of the metal piece by the work of withdrawing the metal piece coupled with the subsequent work of exerting tension upon the metal piece.

SUMMARY OF THE INVENTION

To accomplish the object described above according to the present invention, there is provided a plastic insert-mold element which comprises a plastic female member and a metal piece member partially insert-molded within the female member and provided with one or more frangible portions at which an unnecessary portion of the metal piece member protruding upward from the female member can be torn off.

While the metal piece member is punched out of a metal plate, the frangible portions are formed by cutting a perforation or the like in the metal piece member.

A portion of the metal piece member which protrudes from the female member as the result of drawing the metal piece member outward for securing objects such as plates and is no longer useful, can be torn off the metal piece member at the frangible portions formed on the metal piece member by the continuous work of pulling.

The metal piece member may be extended downward from the female member so as to form an electric terminal, thereby to allow electric connection to be established between the terminal on one side of the object and an electrical part secured on the other side thereof by means of the insert-mold element according to this invention.

BRIEF DESCRIPTION OF THE DRAWINGS

The other objects and the characteristics of the present invention will become apparent from the further disclosure of the invention to be made hereinafter with reference to the accompanying drawings, wherein:

FIG. 21 is a side view of the third embodiment of this invention.

FIGS. 22(A) through 23(B) are explanatory views illustrating in part the insert-mold element of the fourth embodiment according to the present invention.

DESCRIPTION OF THE PREFERRED EMBODIMENTS

First, the present invention will be described with respect to the first embodiment of this invention as applied to what is called a blind rivet.

Figure 1:
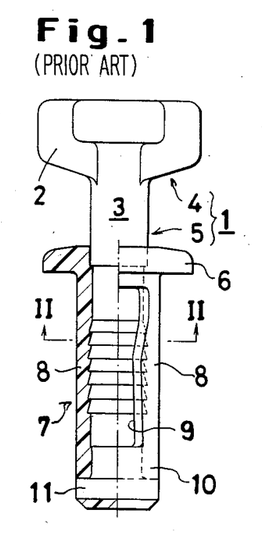
FIG. 1 is a front view illustrating in partial section a conventional blind rivet.
Figures 2, 3:
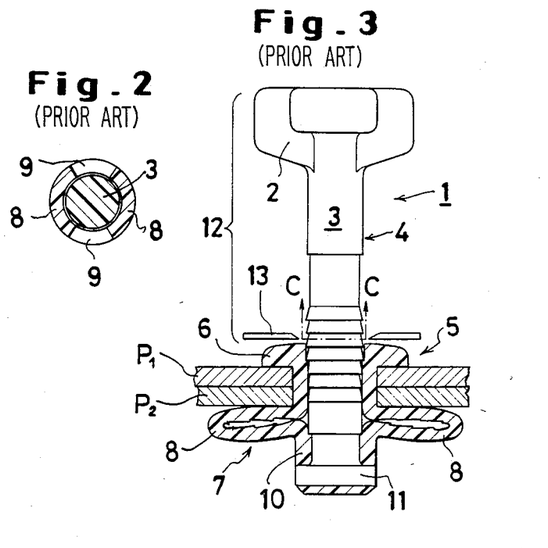
FIG. 2 is a sectional view taken along the line II—II of FIG. 1.
FIG. 3 is a front view illustrating the manner in which the conventional blind rivet is used to fix two plates to each other.

Recently, a blind rivet 1 which is made of plastic as illustrated in FIGS. 1-3 has come to find general acceptance (U.S. Pat. No. 4,222,304). To be brief, the blind rivet 1 is obtained by preparing a male member 4 comprising a head portion 2 and a shank 3 extended downwardly from the head portion 2 and subsequently injection molding with a plastic material a female member 5 of the shape of a rivet as wrapped around the male member 4 except for the head portion 2 and an upper portion of the shank 3. In this case, since the male member 4 has also been molded of a plastic material in a primary mold, it is necessary that at least the portion of the male member 4 destined to be received in a secondary mold used for the shaping of the female member should be coated in advance with a mold release agent in an applied or deposited form.

The female member 5 comprises a head portion 6 of the shape of a flange and a cylindrical member 7 extending downwardly from the head portion 6. The peripheral portion 8 of the cylindrical member 7 is circumferentially divided into a plurality of portions, two portions 8 in the present case, by a plurality of windows 9, one pair of diametrically opposed windows in the present case.

The lower part 10 of the cylindrical member 7 and the lower part 11 of the shank of the male member 4 are joined to each other so that when work is performed to pull out the male member 4 from the female member 5 as will be described fully afterward, the force exerted to pull out or pull up the male member 4 may be sufficiently transmitted to the female member 5. In this case, the union necessary for this purpose is obtained here by radially expanding the lower end 11 of the shank 3.

Once the conventional blind rivet constructed as illustrated in FIGS. 1 to 3 has fulfilled its function of joining two opposed panels $P_1$, $P_2$, the portion 12 of the male member 4 which protrudes upwardly from the flange-shaped head portion 6 becomes a useless and obstructive thing. It has, therefore, been customary for this unnecessary portion 12 to be cut off as indicated by of imaginary line at the arrows C—C. This severance has necessitated the adoption of a separate cutter 13, for example, as illustrated schematically in the drawing.

There is another disadvantage that the shank of the male member 4 is required to be of smaller diameter when the fitting holes are desired to have a smaller diameter. If the diameter of the fitting holes is decreased to about 3 mm, for example, a shank made of a plastic material can no longer withstand the load applied thereto.

When the unnecessary portion 12 of the shank 3 is cut off, the flange-shaped head portion of the female member as viewed downwardly from above is found to bear thereon a large round scar inflicted by the cutting. The scar makes the blind rivet unsightly. This blind rivet, therefore, cannot be used for joining parts for which attractiveness of design matters very much.

By contrast, when the present invention is applied to such a blind rivet, the removal of the unnecessary portion is accomplished immediately subsequent to the joining of the panels, specifically at the same time that the shank is pulled out of the female member of the rivet. The work involved in the actual use of the blind rivet, therefore, is notably improved in efficiency. When desired, all the incidental and inherent shortcomings mentioned above may be completely eliminated by this invention. The blind rivet embodying the present invention will be described with reference to FIGS. 4-13.

Figure 4:
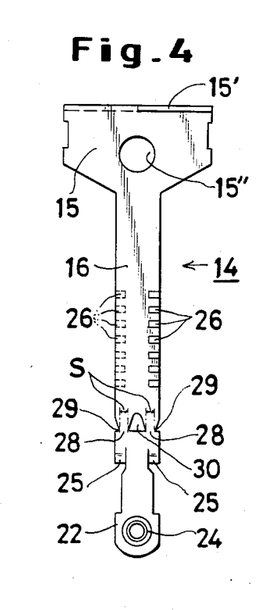
FIGS. 4 and 5 are a front view and a side view illustrating the male member of an insert-mold element of the first embodiment according to the present invention.
Figure 5:
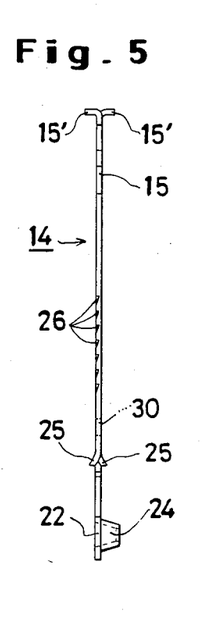

The male member 14 comprises a head portion 15 and a shank 16 extending downwardly from the head portion. Since the male member 14 is punched out of a metal plate by a press, both the head portion and the shank are each formed of a flat plate (FIGS. 4-5). Any material such as, for example, phosphor bronze, may be used for this plate. Particularly when the plate is required to possess strength enough for the shank of a small diameter to withstand its load, stainless steel may be advantageously used as the material for the plate.

The flat shank 16 of the male member 14 is set in position within the mold for producing the female member 17 and the female member 17 is injection molded of a resin material. Consequently, the female member 17 is produced as wrapped around the flat shank 16. This female member 17 has an approximately circular cross section similarly to that of the conventional blind rivet.

The female member 17 which is destined to serve as a rivet comprises a flange-shaped head portion 18 and a cylindrical member 19 extended downwardly from the head portion. An intermediate peripheral portion 21 is rendered slightly flexible by the incorporation therein of a window 20 perforated in the central portion in the longitudinal direction for permitting inspection therethrough of the main surface of the flat shank 16. The portion 21 is radially expanded outwardly when the cylindrical member 19 is axially compressed.

In the meantime, the lower portion 22 of the flat shank 16 and the lower portion 23 of the cylindrical member 19 are required to be joined to each other lest they should separate from each other. The union of the two lower portions is accomplished in the present embodiment by deforming the lower portion 22 of the flat shank 16 thereby giving rise to a protuberance 24 from the lower portion 22 and allowing the protuberance 24 to be embedded within the solid part of the lower portion of the female member 23 so that the drawing force exerted upon the flat shank 16 will be amply transmitted to the cylindrical member 19 as will be more fully described afterward. This connecting protuberance 24 is not always required to be in the shape of a protuberance. Optionally, it may be formed by simply folding the lower portion of the flat shank over itself.

The flat shank 16 is provided at either, preferably both, of the two lateral edges of the portion thereof remaining within the female member after the work of withdrawal to be described more fully afterward, with check claws 25 which are each formed by defining an inward cut in the direction of the width and then a short upward cut in the axial direction and thereafter bending the cut portion so that the lower edge of the cut portion may be disposed out of the plane of the main surface of the flat shank. In this case, the pair of check claws protrude from the flat shank in the opposite directions as clearly illustrated in FIG. 5 and FIG. 7.

The female member 17, accordingly, is required to incorporate therein engaging stepped faces 27 which are brought into engagement with the check claws 25 after the flat shank 16 has been pulled out by a prescribed amount. To serve as molds for such engaging stepped faces, dents 26 for shaping the engaging stepped faces are formed by stamping on the opposite lateral edges of the flat shank 16 in the faces from which the check claws protrude.

Figures 7, 8:
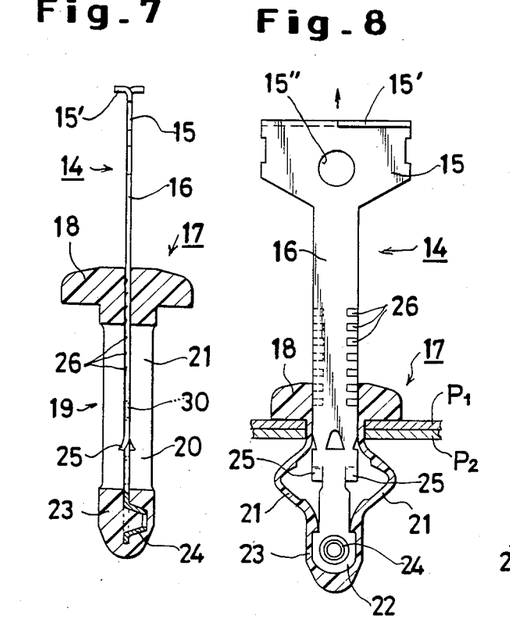
FIGS. 8 through 10 are explanatory views illustrating a process in which the male member is drawn outwardly and torn off.

When the male member which is provided with a plurality of dents 26 as illustrated in FIG. 5 is buried within the female member by insert molding as illustrated in FIG. 7, the portions of plastic resin which fill up these dents form the engaging stepped faces 27. When the engaging stepped faces 27 are formed in a multiplicity of steps as in the present embodiment, the blind rivet used in fastening panels admits of a slight variation in the amount of withdrawal of the flat shank 16 due to a change in the combined thickness of panels being joined, because the check claws 25 come into engagement with the nearest of the multiplicity of engaging stepped faces and prevent the male member from returning and coming loose. The provision of such plurality of engaging stepped faces 27, therefore, proves highly desirable.

In the present embodiment, the flat shank is provided at the position eventually constituting the lower boundary of the unnecessary portion with one or more frangible portions 28 of a narrow width S which is left after inserting notches 29 inwardly from the opposite lateral edges of the flat shank and boring a triangular perforation 30 in the middle of the surface of the flat shank. In this case, the force required for tearing off the frangible portions 28 can be determined by the width S when the material and the thickness of the flat shank are fixed. The width S is designed so that the frangible portions 28 may be torn with a force which is greater than the lifting force required for amply radially expanding the peripheral portion 21 of the cylindrical member 19 and which is as small as possible. The frangible portions 28 are not necessarily required to be formed by the method illustrated. The central perforation 30 may be omitted when the notches 29 inserted from the opposite lateral edges are deep. Conversely, the notches 29 may be omitted when the perforation 30 has an ample width. Otherwise, the frangible portions 28 may be formed by inserting a V-shaped groove serving to decrease the wall thickness in the main surface of the flat shank. In this case, the force required for tearing the frangible portions, namely the shear stress of these portions, can be designed with the depth of the V-shaped groove or the remaining wall thickness in the groove.

Figure 6:
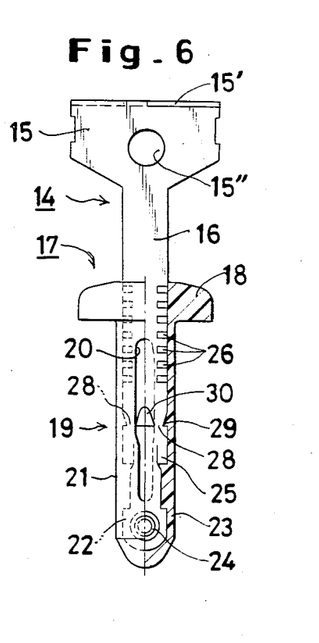
FIGS. 6 and 7 are a front view and a side view each illustrating in partial section the insert-mold element of FIGS. 4 and 5.

Desired fastening of two panels $P_1$, $P_2$ in a superposed state by the use of the blind rivet constructed as described above is accomplished by perforating fitting holes coincidently through the two panels $P_1$, $P_2$ so as to permit passage therethrough of the cylinder 19, inserting through the fitting holes the rivet formed by combining the male member 14 and the female member 17 as illustrated in FIG. 6 and FIG. 7 until the head portion 18 of the female member comes into contact with the surface of the panel $P_1$ and, with the head portion 18 kept held down against the panel, grasping the head portion 15 of the male member such as with a suitable tool (not shown) and pulling it up.

Figure 9:
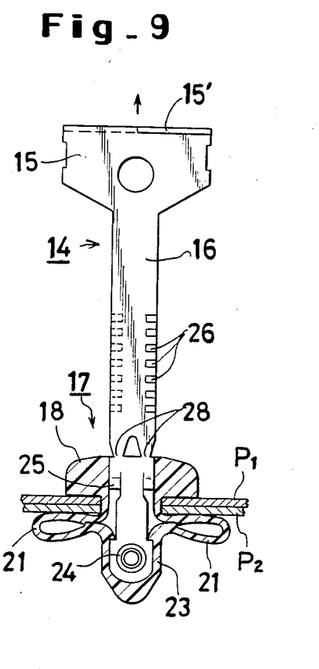

Consequently, the lower portion 23 of the cylinder 19 which is joined to the lower portion 22 of the flat shank 16 begins to rise because it receives a lifting force. Then, owing to the stress tending to decrease the distance between the head portion 18 of the female member which is kept held down and the lower end of the cylinder, the peripheral portion 21 of the cylinder begins to expand radially as though it were peeled off the flat shank 16 as illustrated in FIG. 8. Eventually, the fully expanded peripheral portion 21 of the cylinder and the head portion 18 pinch the panels $P_1$, $P_2$ and fasten them in their superposed state as illustrated in FIG. 9.

In accordance with the construction of this invention, the process which by nature ought to consist of the two separate operations, that is, one operation for lifting the shank 16 to a prescribed amount required for the purpose of radially expanding the cylinder 19 and another operation of subsequently pulling up the shank 16 for the purpose of shearing the unnecessary portion, can be accomplished by one continuous operation of pulling which proceeds quite naturally in terms of the exertion of effort on the part of the worker. Thus, the present invention permits a significant improvement in the efficiency of the work involved in putting the blind rivet to use.

Figure 10:
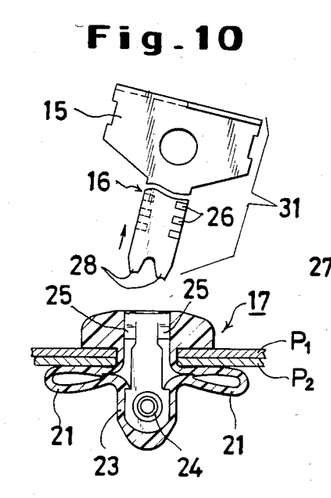
Figures 11A, 11B:
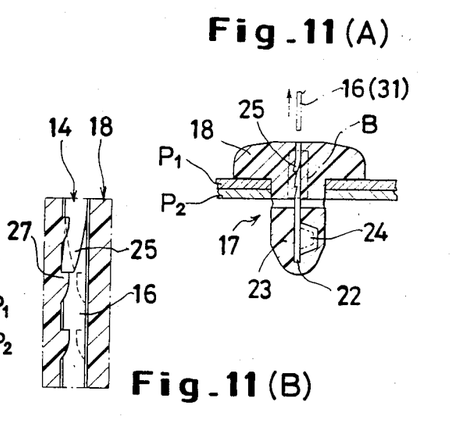
FIGS. 11(A) and 11(B) are a side view and a partly enlarged view of the insert-mold element in the fixed manner.

As illustrated in FIGS. 10 and 11, the portion of the shank 16 which remains within the female member 17 after the unnecessary portion 31 has been torn off must not fall down to its former position but must remain in place for the purpose of maintaining the peripheral portion 21 of the cylinder in its radially expanded state. At this point, this requirement is fulfilled because the check claws 25 formed on the opposed lateral edges of the flat shank 16 as described above are caught on the engaging stepped faces 27 as illustrated in an exaggerated scale in FIG. 11(B).

The head portion 15 of the male member, anticipating exclusive use of a lifting tool therefor, has a rather peculiar shape wherein the portions 15' which constitute the halves of the width of the upper edge of the head portion are bent out in the mutually opposite directions. Of course, the head portion 15 may be formed in any desired shape conforming to the particular tool to be used for the purpose of lifting the head portion.

Figure 12:
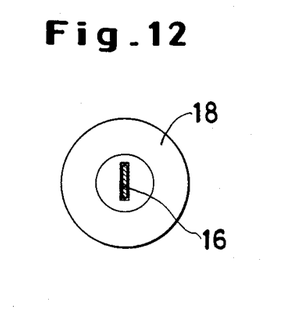
FIG. 12 is a plan view of FIG. 11(A).

The scar which is left after the removal of the unnecessary portion by cutting appears only very slightly on the upper surface of the head portion 18 of the female member as illustrated in FIG. 12. This means that the blind rivet of this invention can be applied practically in its unmodified form even to a part bearing a design.

Moreover, no mold release agent is needed to intervene between the shaft 16 and the female member because the shaft 16 is made of a metallic material. This means that the cost can be proportionately lowered and the work otherwise required for the application of mold release agent can be eliminated. Even when the blind rivet which has already fastened panels, for example, is exposed to heat and the female member is consequently softened to some extent, the male member remains unsoftened and the intimate contact between the check claw and the engaging stepped faces is rather improved by the heat to add to the tightening force exerted upon the panels.

By applying the present invention to this type of blind rivet as described above, the disadvantages suffered by the conventional devices can be completely eliminated and effects heretofore unattained can be imparted.

Figure 13:
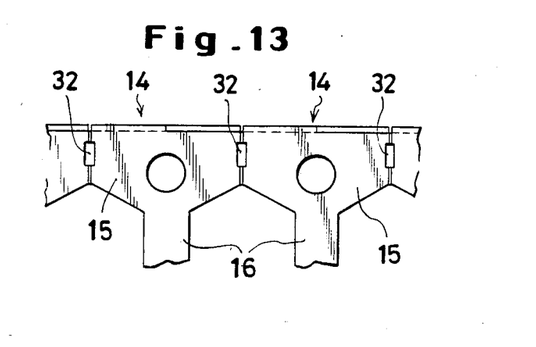
FIG. 13 is a partly enlarged view illustrating the manner in which the male members are laterally connected to one another.
Figure 14:
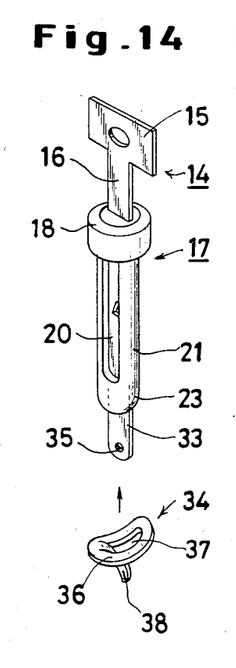
FIGS. 14 and 15 are a perspective view and a side view of the second embodiment according to the present invention.
Figure 15:
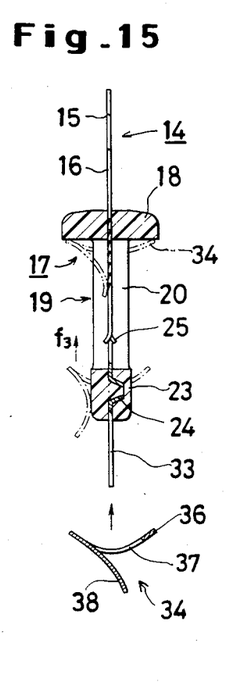

A multiplicity of male members 14 arrayed laterally and connected through the opposed lateral sides of their respective head portions 15 as illustrated in FIG. 13 may be punched out with a press, with V-shaped grooves simultaneously formed one each across the connected portions 32 so that the male members 14 may be separated along the grooves. These male members 14 in their connected state are set in position in a mold containing cavities for shaping as many female members in a similarly arrayed form and the female members are molded with a resin material, to give rise to an array of blind rivets. These blind rivets are removed from the mold and separated one by one. This method enjoys high productivity and proves advantageous from the standpoint of cost.

Now, working examples in which the aforementioned blind rivets are used for fastening elements of electronic circuit parts to substrates and at the same time establishing electrical connection therebetween will be described with reference to FIGS. 14-20.

Not infrequently there are times when a specific portion of the electroconductive pattern on one surface of a printed-circuit board serving as an intermediate member is desired to be drawn out as a terminal, particularly as a planted terminal, to the rear surface or when the collector electrode serving generally as a housing for the bipolar power transistor attached to a radiation substrate is desired to be drawn out to the rear surface of the substrate as insulated from the substrate.

The conventional electric feedthrough terminal which is used in such a case is substantially similar to the ordinary combination of metallic screw and nut.

To be more specific, the electric feedthrough terminal is a construction such that the screw is fed through the intermediate member with the screw head or a portion equivalent to a screw head brought into intimate contact with the planar electroconductive portion and the nut or a nut equivalent in the shape of a peculiar terminal is helically driven around the portion of the screw drawn out of the rear surface of the intermediate member, with an oval lug interposed therebetween.

The feedthrough terminal, therefore, suffers from conspicuous operational inefficiency due to recurring gradual slackening of the joint and consequently inevitable repetition of retightening work as is similarly experienced in the ordinary combination of screw and nut.

Further in the application in which the screw or screw equivalent is required to be fed through the perforation in the intermediate member in an electrically insulated manner, there is entailed a complicated requirement that the intermediate member should be provided with a collar made of plastic or some other proper insulating material and adapted to cover the inner wall surface of the perforation.

This invention also contemplates eliminating the aforementioned disadvantage suffered by the conventional device. To be more specific, this invention is directed to providing an electric feedthrough terminal constructed so that it may be planted in the intermediate member across the opposite surfaces thereof by being simply pulled at from the farther surface thereof, that once it is so planted, it will have no possibility of coming loose from the intermediate member, and that in principle it will enjoy perfect insulation from the intermediate member without particularly requiring any insulating collar.

Now referring back to the drawings, this blind rivet differs essentially from the blind rivet of the former embodiment in the respect that it is possessed of a terminal member 33 extending past the lower part 23 of the female member 17 and exposed to sight and it is also provided with a metal washer 34. In the present embodiment, the terminal member 33 is provided with a perforation 35 adapted to permit easy connection of the terminal of a wire.

Figure 16A:
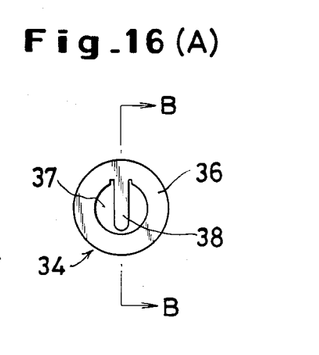
FIGS. 16(A) and 16(B) are a plan view and a side view of the metal washer used in the second embodiment.

The metal washer 34 comprises a ring portion 36 having a proper outside diameter, for example, an outside diameter equalling the outside diameter of the head portion 18 of the female member, for example, and a cantilevered tongue piece 38 extending into a perforation 37 encircled by the ring portion 36 as illustrated in FIG. 16(A). It can be punched out of a metal plate by a press.

The diameter of the perforation 37 in the ring portion 36 must be enough to permit passage of the cylinder 19 of the female member through the perforation.

Figure 16B:
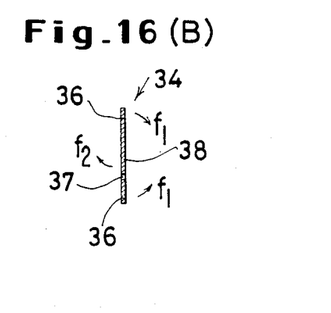

Continuing further, the ring portion 36 is twisted so that the ends opposite in the diameter passing through the center line of the tongue piece 38 will be pushed out upwardly and the leading end of the tongue piece 38 pushed out downwardly as indicated by the arrows $f_1$, $f_2$ in FIG. 16(B). Then the metal washer 34 with its ring portion 36 kept twisted as described above is set in the direction of the arrow $f_3$ onto the cylinder 19 past the lower part 23 of the female member 17 of the rivet as indicated by the dotted line of FIG. 15. It is then pushed up until it comes into fast contact with the underside of the head portion 18.

In this case, while the tongue piece 38 is in the process of going past the thick-wall portion of the lower part 23 of the female member, it is amply bent outwardly to permit passage of the thick-wall portion. Once it has slipped past this portion, the tongue piece 38 springs back toward its original position owing to its own resiliency and, consequently, the leading end thereof finds its way into the window 20 formed in the female member and comes into fast contact with the main surface of the shank 16 of the male member 14 owing to the bounce resiliency. In this manner, the metal washer 34 and the terminal member 33 complete electrical continuity.

In other words, in order for the tongue piece 38 to fulfill the function mentioned above, it is required to have a width small enough for the tongue piece 38 to be admitted into the window 20 of the female member. It is further required to have a length such that the tongue piece will be allowed to come into fast contact with the main surface of the shank 3 while remaining in its slightly twisted state and retaining its resiliency latently.

The adoption of the blind rivet constructed as described above for enabling a specific portion of the electroconductive pattern on one surface of an ordinary printed-circuit board P to be drawn out as a planted terminal to the other surface of the printed-circuit board on which condensers, transistors, and other circuit components are disposed will be described with reference to FIGS. 17, 18, and 19.

In a given planar electroconductive part, Ep, a series of perforations or terminal fitting holes are bored deep enough to go through the substrate P. The terminal poised over the planar electroconductive part Ep is inserted through the part Ep in the order of the terminal part 33 and the lower part 23 of the female member until the ring 36 of the metal washer 34 contacts the part Ep.

Figure 17:
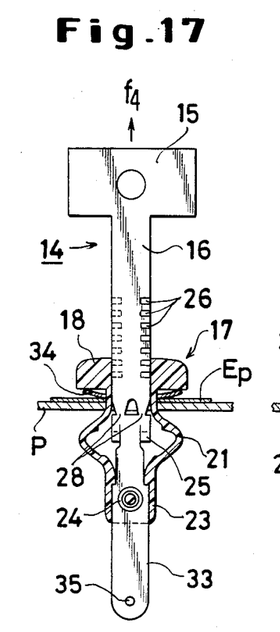
FIGS. 17 through 19 are explanatory views illustrating a process in which the male member of the second embodiment is drawn outwardly and torn off.
Figure 18:
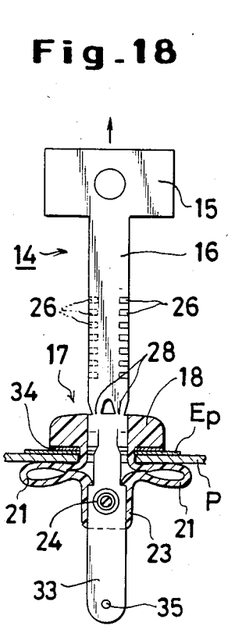

Once the condition described above is assumed, the head portion 18 of the female member is pressed against the substrate P and, at the same time, the head portion 15 of the male member is lifted in the direction of the arrow $f_4$ as illustrated in FIG. 17 with a tool to be described more fully afterward or with some other suitable conventional tool, so that the substrate P may be grasped on the opposite sides thereof. This operation may be carried out by the same procedure as described with respect to the embodiment described already with reference to FIGS. 8, 9, and 10.

Figure 20:
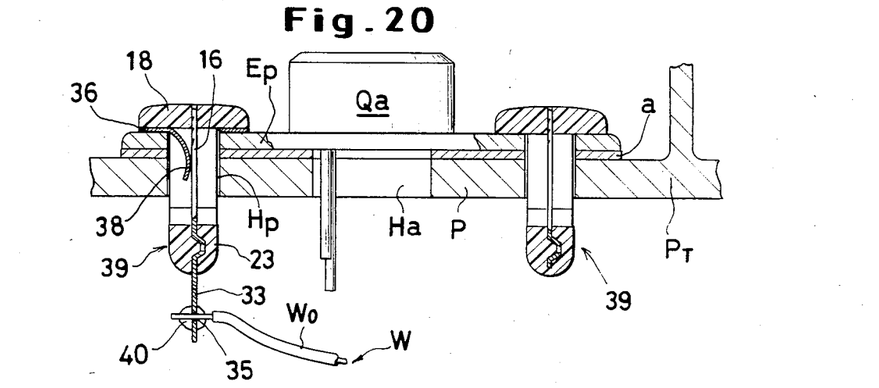
FIG. 20 is an explanatory view illustrating in section the manner in which the insert-mold elements of the first and second embodiments are applied.

This blind rivet can also be used for the purpose of enabling a bipolar transistor Qa to be mechanically fastened on the flange side thereof to a radiation substrate (generally made of a metallic material) and, at the same time, enabling a collector electrode serving as a housing to be electrically drawn out to the rear surface of the substrate as illustrated in FIG. 20.

The substrate P, in its known configuration, is provided on the surface for attachment of transistors with a perforation Ha for amply admitting an emitter and a base electrode lead (or two perforations used exclusively for separate leads) and a pair of fitting holes aligned to the fitting holes formed in the flange serving as a planar electroconductive part Ep of the transistor Qa. This transistor Qa is mounted on the aforementioned surface wherein there is interposed a mica sheet or insulating silicon sheet a capable of radiating heat.

When the diameter of the cylinder of the female member is equalized with that of the perforation Hp, the desired object may be attained as illustrated in FIG. 20 by lifting each of the shanks 16 in substantially the same procedure as in the first embodiment described previously.

In consequence of the procedure described above, the collector electrode of the transistor Qa serving as the planar electroconductive substrate P is drawn out to the terminal part 33 through the contact of the terminal 39 with the ring 36 and the tongue piece 38 of the metal washer 34 and the shank 16 relative to the radiation substrate P serving as the intermediate member. Consequently, the insertion of the collector electrode to the circuit can be accomplished by passing the terminal of the collector wire through a hole 35 of the terminal part and fastening the terminal in position by solder 40, for example.

Owing to the fastening function of this terminal 39 described above, the mechanical union of the transistor Qa at the flange portion thereof to the radiation substrate P can be accomplished with high efficiency and strength.

The aforementioned soldering work and lapping treatment, however, are troublesome. The blind rivet illustrated in FIGS. 21–24 is constructed so as to obviate the necessity for such troublesome work. The modification involved in this construction resides in the fact that the lower part 22 of the shank 16 of the male member is no longer provided with a part 24 for engagement with the lower part of the female member but is only adapted to provide suitable frictional engagement and the fact that the wire-engaging hole 35 in the terminal part 33 is in the shape of a key hole comprising a large-diameter hole 35a for passing the whole outside diameter of the wire W and a slit 35b slightly narrower than the diameter of the core wire Wi.

Figures 21, 22A, 23A:
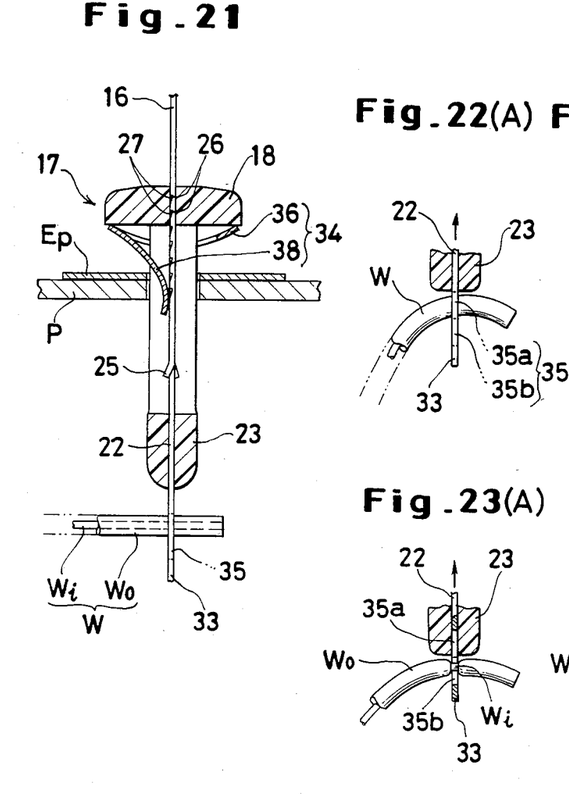
Figure 22B:
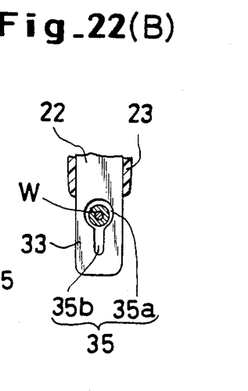
Figure 23B:
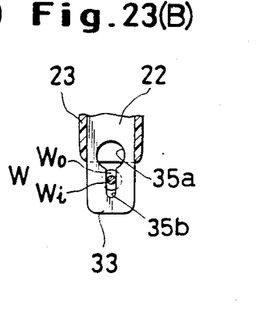
Figure 24A:
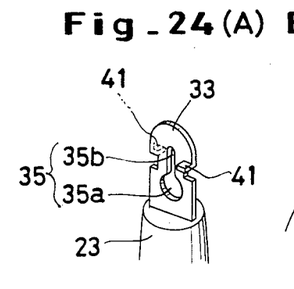
FIGS. 24(A) and 24(B) are explanatory views illustrating in part the insert-mold element of the fifth embodiment according to the present invention.
Figure 24B:
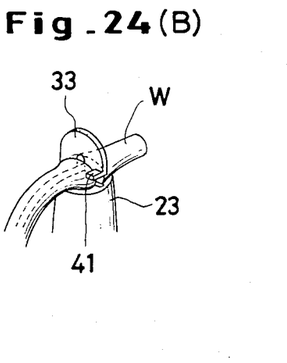

First, the leading end of the wire W as kept coated wholly with its sheath is passed simply through the large-diameter hole 35a as illustrated in FIG. 21. Then, the male member 14 is pulled up. Initially owing to the force generated by the frictional engagement between the lower parts 22 and 23 of the female and male members, the male member is lifted with respect to the head portion 18 which keeps down the lower part 23 of the female member. By the mechanism already described, the intermediate peripheral portion 21 of the cylinder 19 begins to expand radially.

As the radial expansion of the peripheral portion 21 nears its completion and the resisting force exerted by the peripheral portion 21 under deformation increases, there may develop a condition in which the force of the frictional engagement between the lower parts 22 and 23 of the female and male members will yield to the aforementioned resisting force and the shank 16 will slide with the lower part 23.

Even under such a condition, the joint slide of the shank 16 and the lower part 22 is checked when the wire W collides with the lower end of the female member. Thus, the radial expansion of the peripheral portion reaches the final state as illustrated in FIG. 18.

Figure 19:
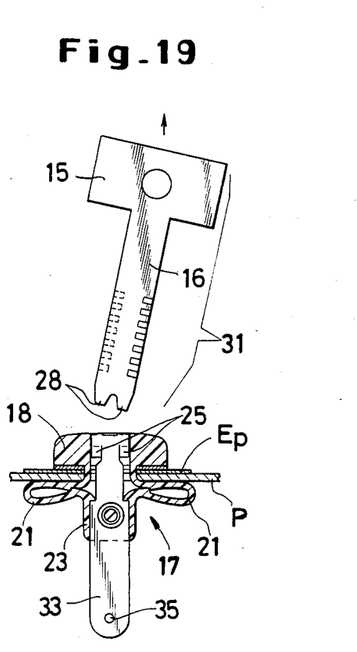

Thereafter, the shank 16 is again caused to slide upwardly by the fairly intense force generated immediately before the unnecessary portion 31 is torn off as illustrated in FIG. 19, with the result that the slit hole 35b on the terminal part 33 has its edges cut into the sheath Wo of the wire and comes into engagement with the core wire Wi (FIG. 23).

As the resisting force generated by the engagement between the core wire Wi and the slit hole 35b gradually increases, the frangible portions 28 are torn as illustrated in FIG. 19, with the desired union completed.

In any event, the sole operation of fastening the terminal, that is, one continuous operation of pulling the male member, brings about a significant effect of simultaneously effecting the desired union and the peeling of the sheath of the wire without specifically requiring post-treatments such as soldering and lapping.

When the resisting force which causes the sheath Wo to be torn away by the edge of the slit hole 35b and the core wire Wi to be pushed into the slit has the possibility of causing the core wire to be torn by the recessed edge of the slit hole 35b before the unnecessary portion 31 is broken off, small claws 41 serving to press down the sheath of the wire near the opposed edges of the slit hole (at this point, the sheath is normally crushed slightly and deformed in the direction of width) may be formed by proper bending work after the stage of press molding, as illustrated in FIG. 24. Then, the small claws break the unnecessary portion 31 before the resisting force tending to press down the sheath of the wire causes the core wire Wi to enter the slit hole too deeply.

Figure 25:
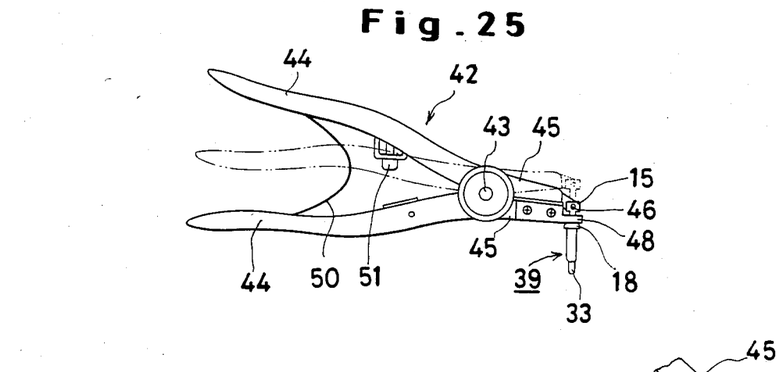
FIGS. 25 and 26 are a side view and a partially perspective view of a tool used for the insert-mold element according to the present invention.

Any suitable tool may be used for lifting or pulling out the male member 14. A typical manual tool advantageously used for this purpose is illustrated in FIGS. 25, 26.

This tool is provided with a pair of handles 44 capable of being pivotal about a fulcrum 43 and finally brought into pinching engagement and a pair of noses 45 which are normally held in a closed state and are pivoted about the fulcrum and consequently separated from each other when the handles 44 are brought closer toward each other. In this respect, the tool resembles an ordinary nipper or radio pliers. On one of the pair of the noses, a rod 46 to be passed through the tool engaging hole 15″ in the head portion 15 of the male member is disposed through the medium of a suitable connecting spacer 47, with the unfastened end thereof left as a free end. On the other nose, a rigid pressing piece 48 adapted to press down the head portion 18 of the female member at its lower end is fixed. In the position of the pressing piece 48 falling below the rod 46, there is inserted a slit 49 which is diverged toward the leading end thereof and is adapted to permit passage of the portion of the shank of the male member protruding from the head portion of the female member.

Figures 26, 27, 28:
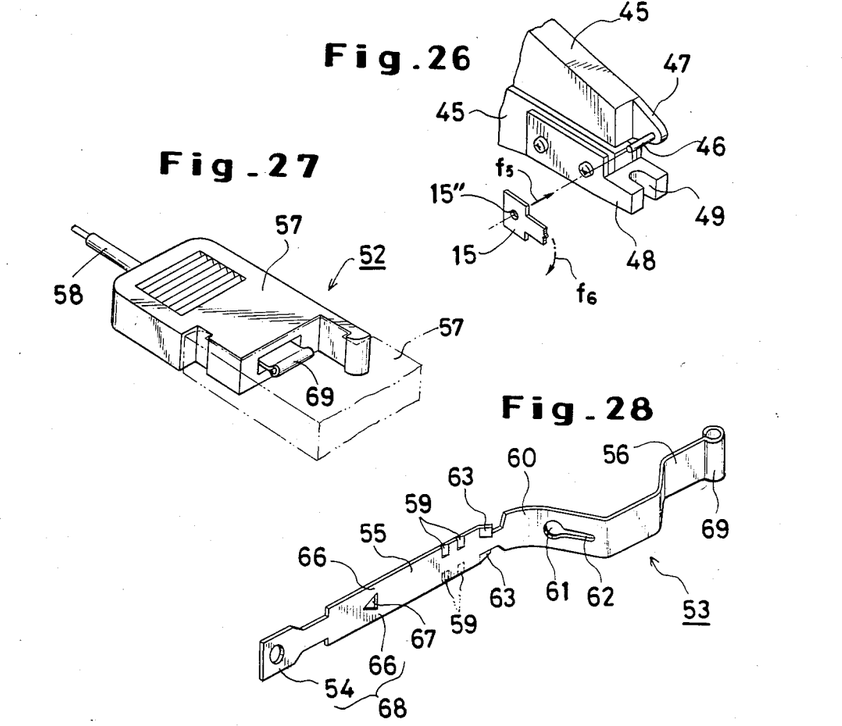
FIGS. 27 through 31 are explanatory views of a connector of the sixth embodiment according to this invention.

The terminal 39 is poised horizontally as illustrated in FIG. 26, the hole 15″ in the head portion 15 is slid over the rod 46 as indicated by the arrow $f_5$, and then the terminal 39 is wholly rotated around the rod as indicated by the arrow $f_6$. Consequently, the downwardly extending part of the head portion enters the slit of the pressing piece 48 and the head portion wholly hangs down and the head portion 18 of the female member assumes its position below the pressing piece 48.

In this condition, the female member is inserted into the fitting hole and then the handles 44 are squeezed against the resilient force of the spring 50. Consequently, the rod 46 is moved upwardly as indicated by the imaginary line of FIG. 25 to pull up the male member 14.

This tool 42 is simple in construction and is very convenient in actual use. For the sake of precaution, this tool is desired to be provided further with a stopper 51 which is capable of adjustably controlling the amount of the opening between the handles, namely, the maximum opening of the noses.

The sixth embodiment to be described hereinafter has a construction which combines a function of physically fixing an electric wire to a metal piece member with a function of stripping the electric wire of its coat and permitting establishment of an electric contact with the electric wire and a function of giving rise to a frangible self-cutting portion. It represents a case wherein the present invention is applied to a connector device which is provided with a contact tongue piece and which, therefore, is allowed to complete required electric continuity by bringing this contact tongue piece into contact with the contact tongue piece of a given device.

The connector 52 in this embodiment will be described with reference to FIGS. 27–30.

Figure 29:
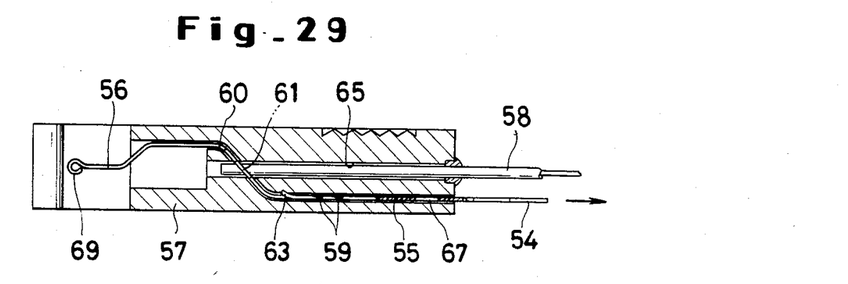

The metal piece member 53 involved in this embodiment comprises a pinch portion 54, a main surface portion 55, and a leading contact tongue piece or contact member 56 which are joined to form one continuous piece. It is produced by punching a strip of prescribed design out of a metal plate with a press and fabricating the strip so as to impart required bends thereto. This metal piece member is set in position within a mold for the injection molding of a plastic connector housing serving as the female member and the metal piece member in the mold is subjected to insert molding with a plastic material. The initial condition of the metal piece member will be described with reference to FIG. 28 illustrating the metal piece member in its independent form and FIG. 29 illustrating the same metal piece member subsequent to formation of a housing 57 thereon. The housing 57 is provided with an insertion hole 65 which opens in the rear end of the housing and which admits an electric wire 58.

The metal piece member 53 is shaped so that part of the main surface portion 53 thereof crosses the insertion hole 65. The part 56 so crossing the insertion hole is perforated with an insertion hole 61 which coincides with the insertion hole 65 and permits passage therethrough of the electric wire 58. A core wire gripping groove 62 having a width smaller than the diameter of the core wire of the electric wire 58 continues on one end thereof into the insertion hole 61 and extends on the other end thereof in the direction departing from the pinch portion 54. The pinch portion 54 is exposed through the rear end of the housing and the contact member 56 is thrust out of the leading end of the housing.

The main surface portion 53 is provided with check claws 63 and grooves 59 to be used for forming on the inner surfaces of the housing by insert molding those engaging stepped surfaces 64 for receiving the check claws into fast engagement therewith. It is further provided with the frangible portion 66 which constitutes itself one of the characteristics of the blind rivet of this invention. Although this frangible portion 66 is formed by the insertion of a triangular perforation 67, it fulfills exactly the same function as described already with respect to the second embodiment.

When the metal piece member 53 in the state described above is pulled by the pinch portion 54 in the direction of departing from the housing 57, it can be slid off inside the housing without requiring any mold release agent because of the difference in nature between the metal and the plastic.

As the metal piece member is slid within the housing, the space so far occupied by the metal piece member within the housing since the completion of the insert-molding now serves as a path for the movement of the metal piece member. Consequently, the metal piece member is slid along this path while entailing elastic deformation in the direction of the rear end, with the result that the groove 62 of a small slit continuing into the electric wire insertion hole 61 breaks into the sheath of the electric wire and eventually gets hold of the core wire.

Figure 30:
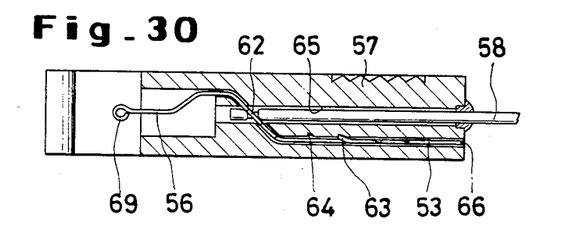

As a result, the electric wire 58 can be seized safely within the plastic member (housing) and, at the same time, electrically connected to the metal piece member 53, with necessary connection established with the contact member 56. The dimensions and three-dimensional shape of the metal piece member from the crossing surface portion 55 through the contact member 56 are fixed so that the contact member 56 will assume its prescribed position as illustrated in FIG. 30 when the state described above is completed. Once this state is achieved, the portion 68 which thrusts out of the rear end of the housing (the portion destined to form this portion 68 is illustrated in FIG. 28) becomes no longer useful. This portion, therefore, is required to be designed in advance so that it will be torn off at the frangible portion at the end of one continued operation of pulling at the metal piece member to be performed for the purpose of fulfilling the aforementioned essential functions.

In accordance with this invention, the fixation of the electric wire within the housing, the coupling of terminals, and the electrical connection of the electric wire to the contact member can be accomplished in the connector of this sort all at once by one externally controlled operation. Unlike the conventional device, this invention does not require the housing to be molded in an openable form but permits it to be formed in a simple construction. Moreover, the portion which terminates in the pinch portion to be externally pulled at and which becomes no longer useful after fulfilling its function cuts itself on completion of the function. Thus, the number of steps required for the completion of the connector is significantly decreased and the efficiency of the work involved is notably improved.

Figure 31:
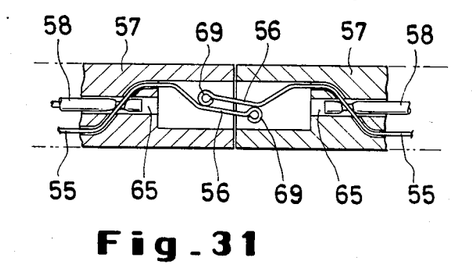

As illustrated in FIG. 31, when the two housings are finally joined to each other, the two opposed contact members 56 come into mutual contact through the medium of their respective cylindrically shaped leading ends 69 and they remain strongly pressed against each other with the resilient force tending to return them to their original shapes. Thus, perfect electric contact is retained therebetween.

The seventh embodiment illustrated in FIGS. 32–36 represents a case wherein a simple two-wire switch such as a handy switch is formed by using in the essential parts thereof the constructions of the second and third embodiments.

Figure 33:
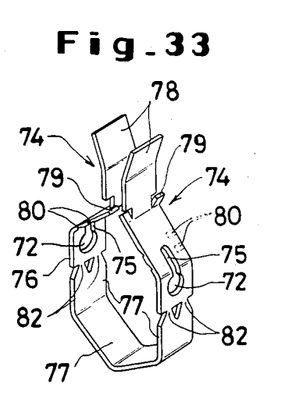

Also in this switch 70, the metal piece members 74 which fulfill the function of taking firm hold of the electric wires 73 inserted into the insertion holes 72a at the opposite ends of the plastic switch housing 71 and the function of stripping the electric wires of their sheath and making electrical connection to the core wires of the electric wires are provided severally in their main surface portions 76 with insertion holes 72 of a diameter equal to or slightly greater than the outside diameter of the electric wires and grooves 75 of a narrow slit continuing into the insertion holes 72 and designed to get hold of the core wires. As illustrated in the diagrams showing the present embodiment, these metal piece members 74 discharge their function by being pulled downwardly. Incidentally, one pinch portion 77 to be used for the purpose of this pulling constitutes itself a joining portion of the pair of metal piece members 74. The pair of metal piece members which are opposed substantially symmetrically to each other, therefore, are formed by punching one strip of prescribed design out of a metal plate with a press and subjecting the strip to fabrication in a three-dimensional shape (FIG. 33).

Figure 34:
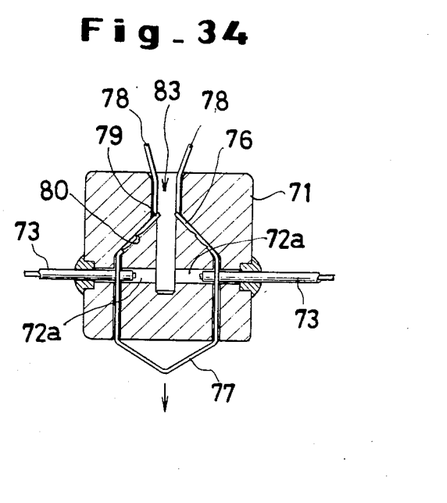

The free ends of the metal piece members form a pair of opposed contact pieces 78. As illustrated in FIG. 34 and as further illustrated by the model of an imaginary line in FIG. 32, the contact pieces 78 are separated from each other at the time that the switch housing 71 is produced by injection molding with a plastic material. Particularly in the present embodiment, they assume their separated positions just outside the housing.

Also in this embodiment, there are formed check claws 79 similar to the check claws described already in the second and third embodiments and grooves 81 to be used for complementary formation within the switch housing of engaging stepped surfaces 80 for admitting the check claws into fast engagement therewith. There is additionally provided frangible portions 82 which are designed in advance to yield to a prescribed shear stress and consequently enable the self-cutting of the unnecessary portion which constitutes one of the characteristics of this invention.

Figure 32:
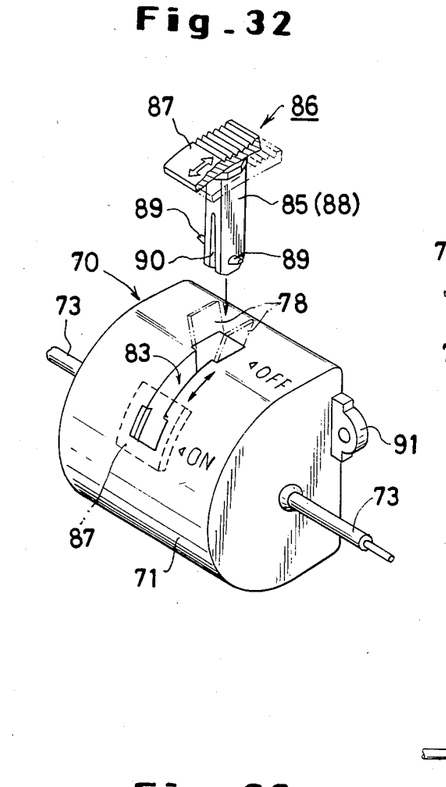
FIGS. 32 through 36 are explanatory views of a switch of the seventh embodiment according to the present invention.

In the plastic housing, the portion which intervenes between the opposed contact pieces 78 forms a cavity 83 extending in the direction of depth and terminating in the insertion hole 72a for admitting the electric wire (FIG. 32).

One pair of electric wires 73 as coated with sheaths are inserted through the respective insertion holes 72a of housing 71 and passed to reach the insertion holes 72 of the respective metal piece members.

In this condition, the pinch portion 77 is grasped and pulled downwardly. Consequently, the metal piece members are allowed through the agency of proper elastic deformation to slide out of position and advance along the space so far occupied by the metal piece members since the completion of insert molding. At the same time, the core wire gripping portions 75 cut into the sheaths of the electric wires 73 and finally get firm hold of the core wires underneath. At the same time, the unnecessary portion 84 which has protruded from the plastic housing 71 after fulfilling its function is torn off and removed because the frangible portions 82 have been broken by the stress from the pull. In the meantime, the check claws 79 are brought into fast engagement with the engaging stepped surfaces 81.

Figure 35:
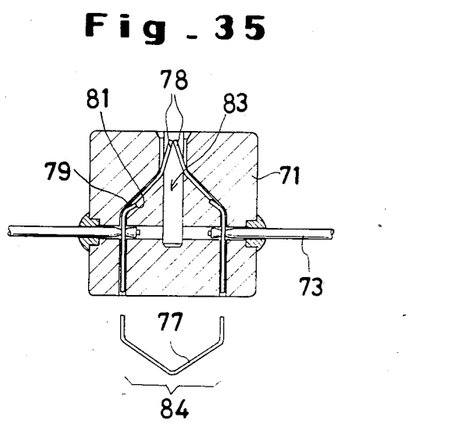
Figure 36:
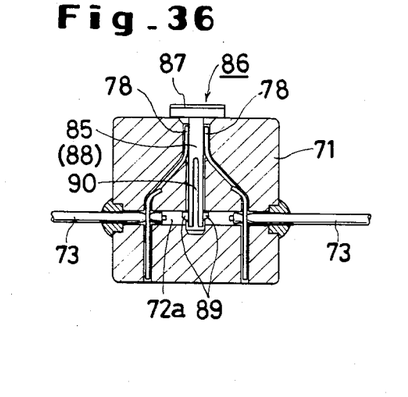

Further in the present embodiment, since the straight portions continuing downwardly from the two contact pieces 78 proceed through the slanted paths so far occupied by the slanted portions of the main surface portions 76, the leading ends of the straight portions inclined toward each other eventually come into resilient mutual contact as illustrated in FIG. 35. The switch 70 thus completed, therefore, remains closed in its normal state.

A pinch member 86 which is provided with an insulating actuator 85 adapted to wedge its way between the opposed contact pieces selectively is possessed of a switch pinch 87 serving the convenience of the worker and a pinch supporting lever 88 extending downwardly from the underside of the switch pinch 87. In the present embodiment, the supporting lever 88 concurrently serves as the actuator 85. In the lower portion of the supporting lever 88, protuberances 89 intended as fulcrums and adapted to be inserted within the electric wire insertion holes 72a are formed. A slit 90 is inserted in the supporting lever 88 upwardly from the lower end thereof. This slit 90 enables the supporting lever 88 to be bent inwardly while the supporting lever 88 is pushed down into the cavity 83 with the protuberances 89 rubbing the inner walls of the cavity. This forced insertion of the supporting lever into the cavity 83 is carried out while the switch is kept in its ON position. After the protuberances 89 have snapped into fast engagement with the openings of the electric wire insertion holes 72a into the aforementioned cavity, the pinch 87 is free to be moved from its ON position to its OFF position or vice versa.

As the pinch 87 is pushed around the protuberances 89 as the fulcrums from its ON position indicated by the imaginary line 87 in FIG. 32 in the direction of its OFF position, the actuator 85 now serving as the supporting lever 88 gradually wedges its way between the two contact pieces 78 and eventually intervenes between the contact pieces 78 to break electric continuity between the electric wires 73. To turn on the switch, the pinch 87 is moved in the direction of its ON position and the actuator is consequently removed from the space intervening the two contact pieces. As a result, the two contact pieces are allowed by their own resiliency to return to their original positions and come into intimate contact.

Such a simple switch as described above can be produced by the adoption of the present invention. Particularly, the fact that the terminal connection, fixation, and electric contact of electric wires are automatically effected by simply inserting the electric wires as coated with sheaths through the openings on the opposite ends of the housing 71 which is formed as a closed one-piece part from the beginning and then pulling the pinch which terminates the protruding portions of the metal piece members and the fact that, on completion of the switch, the unnecessary portion can be removed by one continued operation which proceeds quite naturally on the part of the operator constitute themselves conspicuous effects of this invention. Optionally, the switch may be used more conveniently by providing the housing with a suitable lug piece 91, for example, which permits the housing to be fixed on a suitable substrate.

As described in detail above, this invention provides an improved construction for conferring very broad versatility upon the insert mold element.

Obviously, many modifications and variations of the present invention are possible in light of the above teachings. It is therefore to be appreciated that within the scope of the appended claims, the present invention may be practiced otherwise than as specifically described herein.

What is claimed is:
1. A fastener, comprising:
  a female member fabricated by means of a molding process;
  a male member, insert-molded within said female member and including a head portion and a shank portion, movably disposed, under the influence of a first force, within said female member between a first position at which said female and male mem- bers are relatively disposed with respect to each other so as not to achieve a fastening operation, and a second position at which said female and male members are relatively disposed with respect to each other such that a fastening operation is achieved;

frangible means, provided upon said shank portion of said male member and defining a boundary line between a first section of said shank portion of said male member which is disposed interiorly of said female member when said male member is disposed at said second fastening position relative to said female member, and a second section of said shank portion of said male member connected to said head portion of said male member which is disposed exteriorly of said female member when said male member is disposed at said second fastening position relative to said female member, for facilitating the separation of said second section of said shank portion of said male member from said first section of said shank portion of said male member along said boundary line defined by said frangible means under the influence of a second force which is greater than said first force required to move said male member from said first position to said second position within said female member;

male claw means defined upon said male member at a position upstream of said frangible means as viewed in the direction of movement of said male member from said first position to said second position;

female mold indent means defined upon said male member at a position downstream of said frangible means as viewed in the direction of movement of said male member from said first position to said second position; and male stepped means, defined upon said female member by means of said female mold indent means of said male member as a result of said molding of said female member, for engagement by said male claw means of said male member when said male member is disposed at said second position so as to retain said male member at said second fastened position relative to said female member.

2. The fastener according to claim 1, wherein said frangible means are defined by notches in said shank of said male member.

3. The fastener according to claim 1, wherein said male member is fabricated from metal and further provided with a terminal member extending outwardly from the lower portion thereof.

4. The fastener according to claim 1, wherein said head portion of said male member is further provided with a tool engaging hole.

5. The fastener as set forth in claim 1, wherein: said fastener comprises an electrical connector.

6. The fastener as set forth in claim 1, wherein: said fastener comprises an electrical switch.

7. The fastener according to claim 1, wherein said frangible means are defined by central perforation in said shank of said male member.

8. The fastener according to claim 7, wherein said frangible means are defined by notches in said shank of said male member.

9. A fastener as set forth in claim 1, wherein: said male member is fabricated from metal.

10. The fastener according to claim 1, wherein said male member is further provided on its lower portion with a connecting protuberance for amply transmitting pulling force exerted on the male member to said female member.

11. The fastener according to claim 10, wherein said male member is fabricated from metal and further provided with a terminal member extending outwardly from the lower portion thereof.

12. The fastener according to claim 9, wherein said head portion of the metal member is further provided on the opposite lateral sides with connection portions through which a multiplicity of metal members embedded within the respective female members are brought into integral connection with one another.

13. The fastener according to claim 12, wherein said metal member is further provided with a terminal member extending outwardly from the lower portion thereof.

14. The fastener according to claim 9, wherein said metal member is further provided with a terminal member extending outwardly from the lower portion thereof.

15. The fastener according to claim 14, further comprising a metal washer having a cantilevered tongue piece which comes into contact with said metal member through a window of the female member.

16. The fastener according to claim 15, wherein said terminal member extending outwardly from the lower portion of said metal member has a perforation for permitting an electric wire to be passed therethrough.

17. The fastener according to claim 14, wherein said terminal member extending outwardly from the lower portion of said metal member has a perforation for permitting an electric wire to be passed therethrough.

18. The fastener according to claim 17, wherein said perforation comprises a large-diameter hole for passing a wire having a core therethrough and a slit hole for passing only said core of the wire therethrough.

19. The fastener according to claim 1, wherein said head portion of said male member is further provided at its upper edge with a pair of portions bent out in mutually opposite directions.

20. The fastener according to claim 19, wherein said head portion of said male member is further provided with a tool engaging hole.

21. The fastener as set forth in claim 1, wherein: said fastener comprises a blind rivet.

22. The fastener as set forth in claim 21, further comprising:

longitudinally extending slots defined within sidewall portions of said female member for facilitating radial expansion of said female member as said female member is axially compressed when said male member is moved from said first position to said second position relative to said female member.

23. The fastener as set forth in claim 1, wherein: said female member is fabricated from a plastic material.

24. The fastener as set forth in claim 23, wherein: said male member is fabricated from metal.

25. A fastener, comprising:

a female member fabricated by means of a molding process;

a male member, insert-molded within said female member and including a head portion and a shank portion, movably disposable, under the influence of a first force, within said female member between a first position at which said female and male members are relatively disposed with respect to each other so as not to achieve a fastening operation, and a second position at which said female and male members are relatively disposed with respect to each other such that a fastening operation is achieved;

frangible means, provided upon said shank portion of said male member and defining a boundary line between a first section of said shank portion of said male member which is disposed interiorly of said female member when said male member is disposed at said second fastening position relative to said female member, and a second section of said shank portion of said male member connected to said head portion of said male member which is disposed exteriorly of said female member when said male member is disposed at said second fastening position relative to said female member, for facilitating the separation of said second section of said shank portion of said male member from said first section of said shank portion of said male member along said boundary line defined by said frangible means under the influence of a force which is applied to said male member in substantially the same direction as was said first force for moving said male member from said first position to said second position within said female member;

male claw means defined upon said male member at a position upstream of said frangible means as viewed in the direction of movement of said male member from said first position to said second position;

female mold indent means defined upon said male member at a position downstream of said frangible means as viewed in the direction of movement of said male member from said first position to said second position; and male stepped means, defined upon said female member by means of said female mold indent means of said male member as a result of said molding of said female member, for engagement by said male claw means of said male member when said male member is disposed at said second position so as to retain said male member at said second fastened position relative to said female member.

26. A fastener, comprising:
a female member fabricated by means of a molding process;
a male member, insert-molded within said female member and including a head portion and a shank portion, movably disposable, under the influence of a first force, within said female member between a first position at which said female and male members are relatively disposed with respect to each other so as not to achieve a fastening operation, and a second position at which said female and male members are relatively disposed with respect to each other such that a fastening operation is achieved;

frangible means, provided upon said shank portion of said male member and defining a boundary line between a first section of said shank portion of said male member which is disposed interiorly of said female member when said male member is disposed at said second fastening position relative to said female member, and a second section of said shank portion of said male member connected to said head portion of said male member which is disposed exteriorly of said female member when said male member is disposed at said second fastening position relative to said female member, for facilitating the separation of said second section of said shank portion of said male member from said first section of said shank portion of said male member along said boundary line defined by said frangible means under the influence of a force which is applied to said male member subsequent to said first force and said achievement of said second fastening position by said male member as a result of movement of said male member from said first position to said second position within said female member;

male claw means defined upon said male member at a position upstream of said frangible means as viewed in the direction of movement of said male member from said first position to said second position;

female mold indent means defined upon said male member at a position downstream of said frangible means as viewed in the direction of movement of said male member from said first position to said second position; and male stepped means, defined upon said female member by means of said female mold indent means of said male member as a result of said molding of said female member, for engagement by said male claw means of said male member when said male member is disposed at said second position so as to retain said male member at said second fastened position relative to said female member.

27. An electrical switch type fastener, comprising:
a female member;
a metal male member, having a U-shaped configuration as defined by means of a U-shaped head portion and a pair of shank leg portions connected at one end thereof to opposite sides of said U-shaped head portion with the other ends of said shank leg portions defining free ends, movably disposed under the influence of a first force within said female member between a first position at which said female and male members are relatively disposed with respect to each other so as not to achieve a fastening operation, and a second position at which said female and male members are relatively disposed with respect to each other such that a fastening operation is achieved;

frangible means provided within each of said shank leg portions of said male member for defining a boundary line between a first section of each of said shank leg portions, connected to one of said free end portions of said shank leg portions of said male member, which is disposed interiorly of said female member when said male member is disposed at said second fastening position relative to said female member, and a second section of each of said shank leg portions of said male member, connected to said U-shaped head portion of said male member, which is disposed exteriorly of said female member when said male member is disposed at said second fastening position relative to said female member, for facilitating the separation of each of said second sections of each of said shank leg portions of said male member from said first sections of said shank leg portions of said male member along said boundary lines defined by said frangible means under the influence of a second force which is greater than said first force required to move said male member from said first position to said second position within said female member;

electrical wire means for establishing electrical connection with each one of said first sections of said shank leg portions; and means movably disposed within said female member between a first position at which electrical connection between said two free end portions of said first sections of said shank leg portions of said male member is established so as to dispose an electrical switch in an ON state, and a second position at which electrical connection between said two free end portions of said first sections of said shank leg portions of said male member is terminated so as to dispose said electrical switch in an OFF state.

* * * * *